US012751226B2

(12) United States Patent
Yao et al.

(10) Patent No.: US 12,751,226 B2
(45) Date of Patent: Sep. 29, 2026

(54) SELECTIVE ETCHING BETWEEN SILICON-AND-GERMANIUM-CONTAINING MATERIALS WITH VARYING GERMANIUM CONCENTRATIONS

(71) Applicant: Applied Materials, Inc., Santa Clara, CA (US)

(72) Inventors: Bin Yao, Santa Clara, CA (US); Zihui Li, Santa Clara, CA (US); Chia-Ling Kao, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 211 days.

(21) Appl. No.: 18/790,457

(22) Filed: Jul. 31, 2024

(65) Prior Publication Data

US 2026/0040851 A1 Feb. 5, 2026

(51) Int. Cl.
*H10P 50/24* (2026.01)
*H10P 14/60* (2026.01)

(52) U.S. Cl.
CPC ........ *H10P 50/242* (2026.01); *H10P 14/6308* (2026.01); *H10P 14/6514* (2026.01)

(58) Field of Classification Search
None
See application file for complete search history.

(56) References Cited

U.S. PATENT DOCUMENTS 9,236,256 B2 1/2016 Klipp et al.
2016/0336445 A1 11/2016 Colinge et al.
2016/0336448 A1 11/2016 Lee et al.
2021/0398814 A1 12/2021 Hung et al.
(Continued)

FOREIGN PATENT DOCUMENTS

KR 20240099543 A 7/2024

OTHER PUBLICATIONS

International Application No. PCT/US2025/038063, International Search Report and Written Opinion mailed on Nov. 19, 2025, 10 pages.
(Continued)

*Primary Examiner* — Roberts P Culbert
(74) *Attorney, Agent, or Firm* — Kilpatrick Townsend & Stockton LLP

(57) ABSTRACT

Exemplary semiconductor processing methods may include providing a pre-treatment precursor to a processing region of a semiconductor processing chamber. A substrate may be housed having a first layer of silicon-and-germanium-containing material and a second layer of silicon-and-germanium-containing material may be housed within the processing region. A native oxide may be present. The methods may include contacting the substrate with the pre-treatment precursor to remove the native oxide. The methods may include contacting the substrate with an oxygen-containing precursor to oxidize at least a portion of the first layer of silicon-and-germanium-containing material and at least a portion of the second layer of silicon-and-germanium-containing material. The methods may include contacting the substrate with an etchant precursor to selectively etch the first layer of silicon-and-germanium-containing material.

20 Claims, 6 Drawing Sheets

(56) References Cited

U.S. PATENT DOCUMENTS

| | | | | |
|---|---|---|---|---|
| 2023/0290647 | A1 | 9/2023 | Wang et al. | |
| 2024/0128088 | A1 | 4/2024 | Kanaki et al. | |
| 2024/0194487 | A1 * | 6/2024 | Zhao .................... | H10D 30/014 |

OTHER PUBLICATIONS

Taiwanese Application No. 114129143, Office Action mailed on Mar. 30, 2026, 5 pages (4 pages of original document and 1 page of English Translation).

* cited by examiner

SELECTIVE ETCHING BETWEEN SILICON-AND-GERMANIUM-CONTAINING MATERIALS WITH VARYING GERMANIUM CONCENTRATIONS

TECHNICAL FIELD

The present technology relates to semiconductor processes and equipment. More specifically, the present technology relates to selectively etching silicon-and-germanium-containing material.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary semiconductor processing methods may include providing a pre-treatment precursor to a processing region of a semiconductor processing chamber. A substrate may be housed within the processing region. A first layer of silicon-and-germanium-containing material and a second layer of silicon-and-germanium-containing material may be disposed on the substrate. A native oxide may be present on the first layer of silicon-and-germanium-containing material and the second layer of silicon-and-germanium-containing material. The methods may include contacting the substrate with the pre-treatment precursor. The contacting may remove the native oxide from the first layer of silicon-and-germanium-containing material and the second layer of silicon-and-germanium-containing material. The methods may include providing an oxygen-containing precursor to the processing region. The methods may include contacting the substrate with the oxygen-containing precursor. The contacting may oxidize at least a portion of the first layer of silicon-and-germanium-containing material and at least a portion of the second layer of silicon-and-germanium-containing material. The methods may include providing an etchant precursor to the processing region. The methods may include contacting the substrate with the etchant precursor. The contacting may selectively etch the first layer of silicon-and-germanium-containing material.

In some embodiments, the first layer of silicon-and-germanium-containing material may be characterized by a first germanium concentration. The second layer of silicon-and-germanium-containing material may be characterized by a second germanium concentration. The first germanium concentration may be greater than the second germanium concentration. The pre-treatment precursor may be or include a hydrogen-containing precursor or a nitrogen-containing precursor. The hydrogen-containing precursor may be or include diatomic hydrogen ($H_2$) or ammonia ($NH_3$). The nitrogen-containing precursor may be or include diatomic nitrogen ($N_2$) or $NH_3$. The methods may include forming plasma effluents of the pre-treatment precursor. The oxygen-containing precursor may be or include diatomic oxygen ($O_2$) or steam ($H_2O$). The processing region may be maintained plasma-free while contacting the substrate with the oxygen-containing precursor. A temperature in the processing region may be maintained at less than or about 100° C. A pressure in the processing region may be maintained at greater than or about 3 Torr. The contacting may etch the first layer of silicon-and-germanium-containing material relative to the second layer of silicon-and-germanium-containing material at a selectivity of greater than or about 20:1. Contacting the substrate with the pre-treatment precursor, contacting the substrate with the oxygen-containing precursor, and contacting the substrate with the etchant precursor may be performed on a single mainframe.

Some embodiments of the present technology may encompass semiconductor processing methods. The methods may include providing an oxygen-containing precursor to a processing region of a semiconductor processing chamber. A substrate may be housed within the processing region. A first layer of silicon-and-germanium-containing material and a second layer of silicon-and-germanium-containing material may be disposed on the substrate. The first layer of silicon-and-germanium-containing material may be characterized by a greater germanium concentration than the second layer of silicon-and-germanium-containing material. The methods may include contacting the substrate with the oxygen-containing precursor. The contacting may at least partially oxidize the first layer of silicon-and-germanium-containing material to a greater degree than the second layer of silicon-and-germanium-containing material. The methods may include providing a fluorine-containing precursor to the processing region. The methods may include contacting the substrate with the fluorine-containing precursor. The contacting may etch the first layer of silicon-and-germanium-containing material relative to the second layer of silicon-and-germanium-containing material at a selectivity of greater than or about 40:1.

In some embodiments, the first layer of silicon-and-germanium-containing material may be characterized by a germanium concentration of greater than or about 25 at. %. The second layer of silicon-and-germanium-containing material may be characterized by a germanium concentration of less than or about 20 at. %. The oxygen-containing precursor may be or include water or steam ($H_2O$). The processing region may be maintained plasma-free while contacting the substrate with the oxygen-containing precursor and while contacting the substrate with the fluorine-containing precursor. A native oxide may be present on the first layer of silicon-and-germanium-containing material and the second layer of silicon-and-germanium-containing material. The method may further include providing a pre-treatment precursor to the processing region and contacting the substrate with the pre-treatment precursor. The contacting may remove the native oxide from the first layer of silicon-and-germanium-containing material and the second layer of silicon-and-germanium-containing material.

Some embodiments of the present technology may encompass semiconductor processing methods. The methods may include providing a hydrogen-containing precursor or a nitrogen-containing precursor to a processing region of a semiconductor processing chamber. A substrate may be housed within the processing region. A first layer of silicon-and-germanium-containing material and a second layer of silicon-and-germanium-containing material may be disposed on the substrate. The first layer of silicon-and-germanium-containing material may be characterized by a greater germanium concentration than the second layer of silicon-and-germanium-containing material. A native oxide may be present on the first layer of silicon-and-germanium-containing material and the second layer of silicon-and-germanium-containing material. The methods may include contacting the substrate with the hydrogen-containing precursor or the nitrogen-containing precursor. The contacting may remove the native oxide from the first layer of silicon-and-germanium-containing material and the second layer of silicon-and-germanium-containing material. The methods may include providing an oxygen-containing precursor to the processing region. The oxygen-containing precursor may be or include water or steam ($H_2O$). The methods may include contacting the substrate with the oxygen-containing precursor. The contacting may oxidize at least a portion of the first layer of silicon-and-germanium-containing material and at least a portion the second layer of silicon-and-germanium-containing material. The processing region may be maintained plasma-free while contacting the substrate with the oxygen-containing precursor. The methods may include providing a fluorine-containing precursor to the processing region. The methods may include contacting the substrate with the fluorine-containing precursor. The contacting may selectively etch the first layer of silicon-and-germanium-containing material. The processing region may be maintained plasma-free while contacting the substrate with the fluorine-containing precursor.

In some embodiments, a temperature in the processing region may be maintained at less than or about 75° C. Contacting the substrate with the fluorine-containing precursor may etch the first layer of silicon-and-germanium-containing material relative to the second layer of silicon-and-germanium-containing material at a selectivity of greater than or about 10:1.

Such technology may provide numerous benefits over conventional systems and techniques. For example, the processes may oxidize one silicon-and-germanium-containing material to a greater degree relative to another silicon-and-germanium-containing material prior to etching operations. Additionally, the oxidation may permit selective etching of silicon-and-germanium-containing material characterized by a higher germanium concentration relative to silicon-and-germanium-containing material characterized by a lesser germanium concentration. These and other embodiments, along with many of their advantages and features, are described in more detail in conjunction with the below description and attached figures.

BRIEF DESCRIPTION OF THE DRA WINGS

A further understanding of the nature and advantages of the disclosed technology may be realized by reference to the remaining portions of the specification and the drawings.

Figure 1:
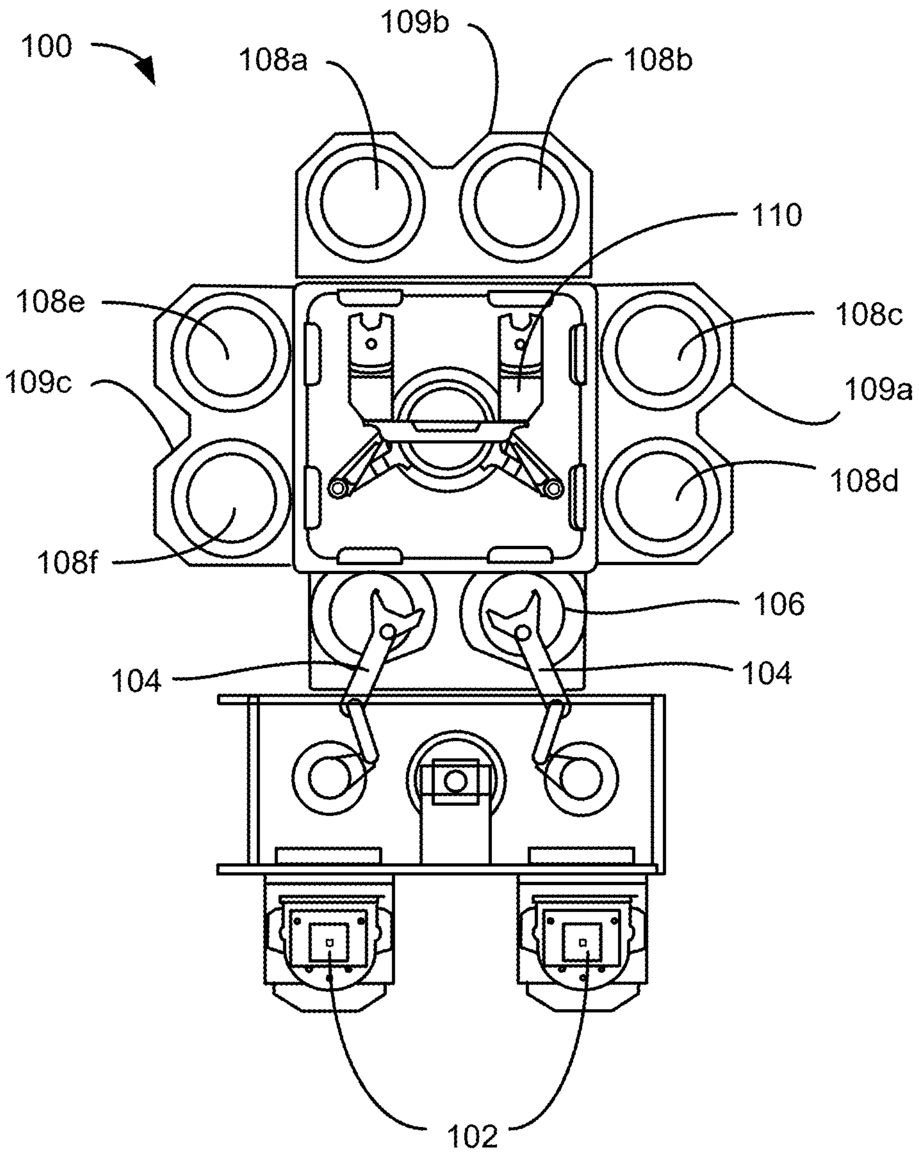
FIG. 1 shows a top plan view of one embodiment of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include superfluous or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning to complementary field-effect transistors (CFETs), many process operations are modified from more conventional fin field-effect transistors (FinFETs). Additionally, as structures continue to reduce in size, the thicknesses of material layers reduce and the aspect ratios of memory holes and other structures increase, sometimes dramatically.

During CFET processing, alternating layers of material are deposited on a substrate, such as layers of silicon-containing material and silicon-and-germanium-containing material. In forming the transistor, features may be patterned through the alternating layers of material. Subsequent patterning, one silicon-and-germanium-containing material, such as silicon-and-germanium-containing material serving as a dummy material may be removed relative to other materials, including other silicon-and-germanium-containing material on the substrate.

Because of the similar materials in some CFETs, selectively removing one silicon-and-germanium-containing material relative to another silicon-and-germanium-containing material may become increasingly difficult. For example, multiple silicon-containing materials, including multiple silicon-and-germanium-containing materials may be used in CFET processing. In some operations, it may be desirable to remove one silicon-and-germanium-containing material, such as silicon-and-germanium-containing serving as a dummy material where middle dielectric isolation material may be formed, relative to other silicon-and-germanium-containing material and other silicon-containing materials, such as materials serving as gates and channels in the CFETs, respectively. Conventional technologies have struggled with selectively removing one silicon-and-germanium-containing material relative to another silicon-and-germanium-containing material. The non-selective removal may result in undesirable etching of some material, such as silicon-and-germanium-containing material serving as gates in the CFETs.

The present technology overcomes these issues by performing an oxidation prior to etching silicon-and-germanium-containing material, such as the silicon-and-germanium-containing material serving as a dummy material. The oxidation of the silicon-and-germanium-containing materials may oxidize materials characterized by higher germanium concentrations to a higher degree. Therefore, the oxidation may preferentially oxidize silicon-and-germanium-containing material characterized by a higher germanium concentration, such as the silicon-and-germanium-containing material serving as a dummy material. A subsequent etch may more easily breakthrough the oxidation and, therefore, may begin etching the silicon-and-germanium-containing material characterized by a higher germanium concentration quicker. The subsequent etch may selectively remove the silicon-and-germanium-containing material characterized by a higher germanium concentration relative to the other materials. Thus, the etching operations of the present technology may selectively remove one silicon-and-germanium-containing material while maintaining another silicon-and-germanium-containing material in addition to other silicon-containing materials.

Although the remaining disclosure will routinely identify specific etching processes utilizing the disclosed technology, it will be readily understood that the systems and methods are equally applicable to etching processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108*a-f* may include one or more system components for depositing, annealing, curing and/or etching a dielectric film on the substrate wafer. In one configuration, two pairs of the processing chambers, e.g., 108*c-d* and 108*e-f*, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
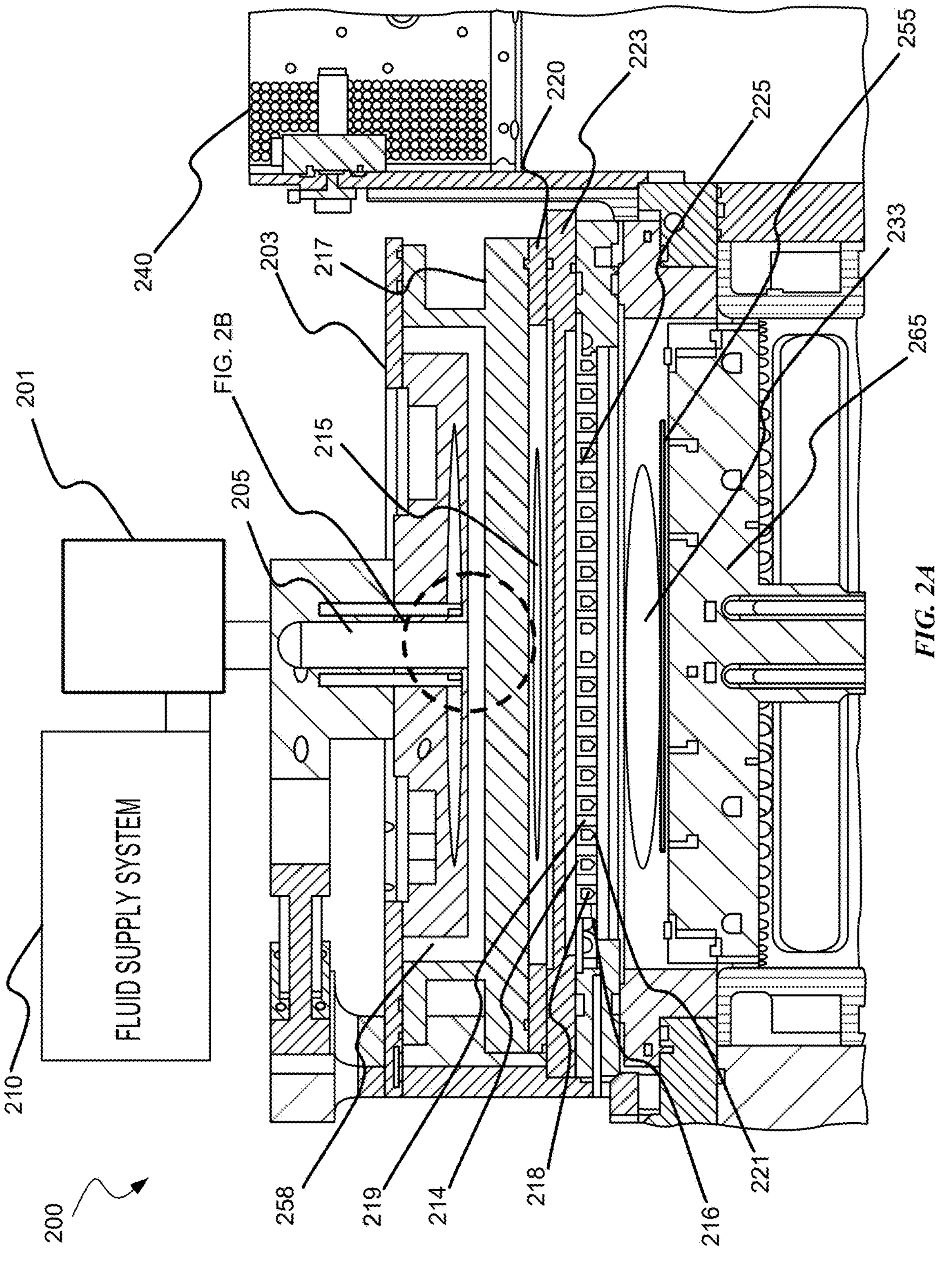
FIG. 2A shows a schematic cross-sectional view of an exemplary processing chamber according to embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system (RPS) 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may comprise aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively coupled plasma (CCP) to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures. As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., $SiGe_x:SiO_x$ etch ratios, $SiGe_x:Si$ etch ratios, $SiGe_x:SiGe_y$ etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which materials may be etched increase. Accordingly, an exposed region of material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency (RF) range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHZ frequency.

Figure 2B:
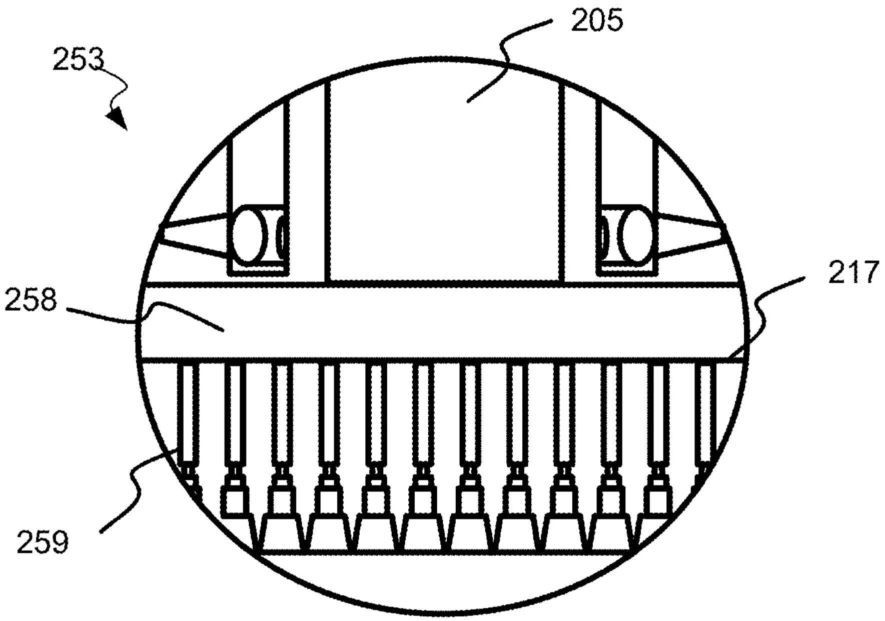
FIG. 2B shows a detailed view of a portion of the processing chamber illustrated in FIG. 2A according to embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
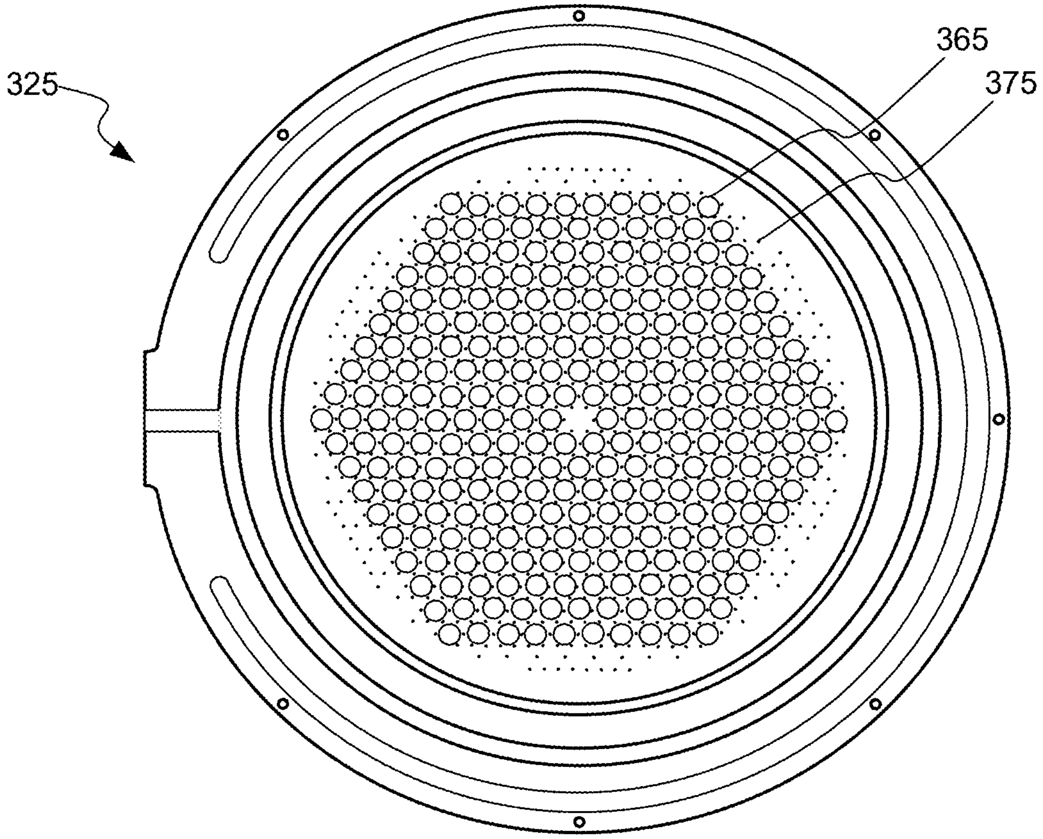
FIG. 3 shows a bottom plan view of an exemplary showerhead according to embodiments of the present technology.

The gas distribution assemblies such as showerhead 225 for use in the processing chamber section 200 may be referred to as dual channel showerheads (DCSH) and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
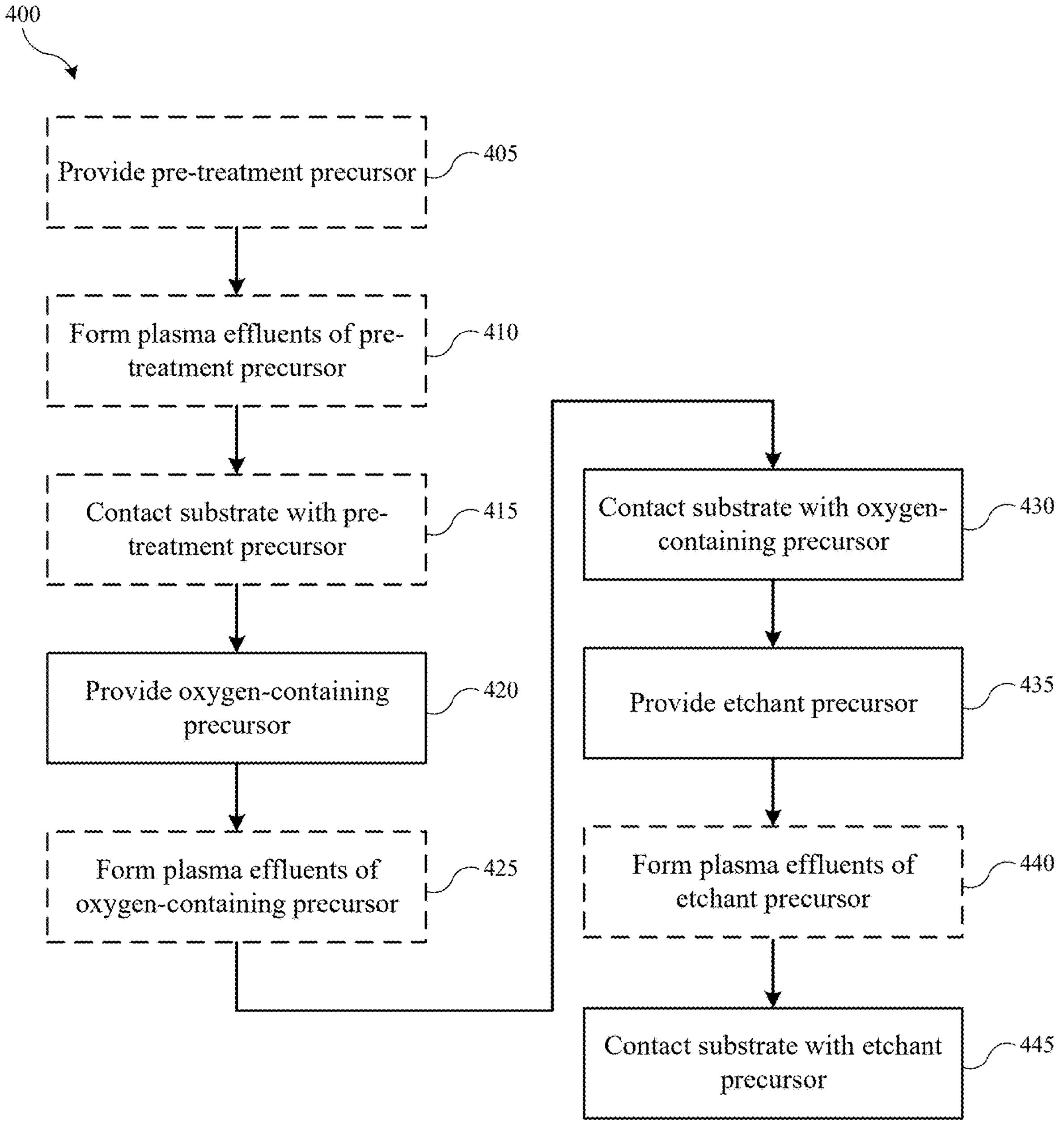
FIG. 4 shows exemplary operations in a method according to embodiments of the present technology.

The chambers discussed previously may be used in performing exemplary methods including etching methods. Turning to FIG. 4, exemplary operations in a method 400 according to embodiments of the present technology are illustrated. Prior to the first operation of the method 400, a substrate may be processed in one or more ways before being placed within a processing region of a chamber in which method 400 may be performed. For example, alternating layers of material may be formed on the substrate and then one or more memory holes or trenches may be formed through the alternating layers. The alternating layers may include any number of materials, and may include alternating layers of silicon-containing material and silicon-and-germanium-containing material. For example, the alternating layers may include a first layer of silicon-and-germanium-containing material characterized by a first germanium concentration and a second layer of silicon-and-germanium-containing material characterized by a second germanium concentration. In embodiments, the first germanium concentration may be greater than the second germanium concentration. The alternating layers may also include a layer of silicon-containing material. Although the remaining disclosure will discuss silicon-containing material and silicon-and-germanium-containing material, any other known materials used in these layers may be substituted for one or more of the layers. Some or all of these operations, such as the formation of alternating layers of material as well as the patterning of holes or trenches, may be performed in chambers or system tools as previously described, or may be performed in different chambers on the same system tool, which may include the chamber in which the operations of method 400 are performed.

The method 400 may include providing a treatment precursor, such as a pre-treatment precursor or pre-etching precursor, to a semiconductor processing chamber at optional operation 405. In some embodiments, an inert precursor may be provided with the treatment precursor. An exemplary chamber may be chamber 200 previously described, which may include one or both of the RPS unit 201 or first plasma region 215. A plasma may be formed at optional operation 410, which may form plasma effluents of the treatment precursor. The substrate may be contacted with the treatment precursor or, if formed, the plasma effluents of the treatment precursor at optional operation 415. The contacting at optional operation 415 may remove a native oxide that is present on the first layer of silicon-and-germanium-containing material, the second layer of silicon-and-germanium-containing material, and/or the layer of silicon-containing material on the substrate.

Operations of method 400 to develop the structure may include removing or etching one or more materials. To increase selectivity during the removal or etching, the method 400 may include providing an oxygen-containing precursor to the processing region at operation 420, optionally forming plasma effluents of the oxygen-containing precursor at optional operation 425, and contacting the substrate with the oxygen-containing precursor, or plasma effluents thereof, at operation 430. The contacting at operation 430 may oxidize at least a portion of first layer of silicon-and-germanium-containing material, the second layer of silicon-and-germanium-containing material.

Subsequent an amount of oxidation, method 400 may include providing an etchant precursor to the processing region at operation 435, optionally forming plasma effluents of the etchant precursor at optional operation 440, and contacting the substrate with the etchant precursor at operation 445. The contacting at operation 445 may selectively etch the first layer of silicon-and-germanium-containing material, which may be a dummy material serving as a placeholder for a middle dielectric isolation layer in a field-effect transistor (FET), such as a CFET. The contacting at operation 445 may selectively etch the first layer of silicon-and-germanium-containing material relative to the second layer of silicon-and-germanium-containing material, which may be a gate in a FET, such as a CFET, and the layer of silicon-containing material, which may be channel in a FET, such as a CFET.

Method 400 may involve oxidizing multiple silicon-and-germanium-containing materials on a substrate. Silicon-and-germanium-containing material characterized by a higher germanium concentration may be oxidized to a greater degree relative to silicon-and-germanium-containing material characterized by a lesser germanium concentration. This difference in oxidation may be due to the germanium concentrations of the materials. The germanium in the silicon-and-germanium-containing materials may preferentially oxidize over silicon or other constituents within the silicon-and-germanium-containing materials. The silicon-and-germanium-containing material characterized by a higher germanium concentration may be oxidized to a greater degree due to the increased amount of germanium present. A subsequent etch may breakthrough oxidized portions of the silicon-and-germanium-containing materials faster. Due to the increased amount of oxidation in the silicon-and-germanium-containing material characterized by a higher germanium concentration, the subsequent etch may begin etching the silicon-and-germanium-containing material characterized by a higher germanium concentration faster. The method 400 may allow for the selective removal of one silicon-and-germanium-containing material relative to another silicon-and-germanium-containing material or other silicon-containing materials on the substrate. Accordingly, in CFET processing, for example, the silicon-and-germanium-containing material characterized by a higher germanium concentration, such as a dummy material which may be serving as a placeholder for middle dielectric isolation material, may be etched or released selectively to the silicon-and-germanium-containing characterized by a lesser germanium concentration, such as gate material.

Precursors provided to the processing region in the method 400 at optional operation 405 may include a treatment precursor, such as a pre-treatment precursor or pre-etching precursor, as well as optionally an inert precursor. An exemplary treatment precursor may be a hydrogen-containing precursor, a nitrogen-containing precursor, or combinations thereof, which may be flowed into the processing region. The hydrogen-containing precursor may be or include, for example, molecular hydrogen ($H_2$), ammonia ($NH_3$), or any other hydrogen-containing precursor used or useful in semiconductor processing. The nitrogen-containing precursor may be or include, for example, molecular nitrogen ($N_2$), ammonia ($NH_3$), or any other nitrogen-containing precursor used or useful in semiconductor processing. The treatment precursor may be provided with an inert precursor in some embodiments. The inert precursor may be or include, for example, argon, helium, xenon, or other noble, inert, or useful precursors. The inert precursor may be used to dilute the treatment precursor or to assist in distributing the treatment precursor throughout the processing region.

If formed at optional operation 410, the plasma effluents of the treatment precursor and the inert precursor, if present, may be generated at a plasma power of less than or about 5,000 W, and may be generated at less than or about 4,750 W, less than or about 4,500 W, less than or about 4,250 W, less than or about 4,000 W, less than or about 3,750 W, less than or about 3,500 W, less than or about 3,250 W, less than or about 3,000 W, less than or about 2,750 W, less than or about 2,500 W, less than or about 2,250 W, less than or about 2,000 W, less than or about 1,750 W, less than or about 1,500 W, less than or about 1,250 W, less than or about 1,000 W, less than or about 750 W, less than or about 500 W, less than or about 250 W, or less.

The substrate may be contacted with the treatment precursor or, if formed, plasma effluents of the treatment precursor at optional operation 415 for a sufficient period of time to remove native oxide from the structure, such as from silicon-and-germanium containing material(s) in the structure. In embodiments, the period of time may be greater than or about 3 seconds, greater than or about 5 seconds, greater than or about 10 seconds, greater than or about 20 seconds, greater than or about 30 seconds, greater than or about 40 seconds, greater than or about 50 seconds, greater than or about 1 minute, greater than or about 2 minutes, greater than or about 3 minutes, greater than or about 5 minutes, or higher. The period of time may be sufficient to remove greater than or about 85% of the native oxide from the structure, and greater than or about 90%, greater than or about 95%, greater than or about 97%, greater than or about 99%, greater than or about 99.9%, or higher, or all of the native oxide may be removed from the structure.

In embodiments, method 400 may include providing an oxygen-containing precursor to the processing region of the semiconductor processing chamber at operation 420. In some embodiments, an inert precursor may be provided with the oxygen-containing precursor. The oxygen-containing precursor may be or include, for example, molecular oxygen ($O_2$), water or steam ($H_2O$), hydrogen peroxide ($H_2O_2$), or any other oxygen-containing precursor used or useful in semiconductor processing. In embodiments, $H_2O$ may be used to control the oxidative effect since $H_2O$ serves as a mild oxidant. The inert precursor may be or include, for example, argon, helium, xenon, or other noble, inert, or useful precursors. The inert precursor may be used to dilute the oxygen-containing precursor, which may further reduce oxidation rates to control the oxidation and the selectivity of the oxidation, or to assist in distributing the oxygen-containing precursor throughout the processing region. Additionally, a flow rate ratio of the oxygen-containing precursor and, if present, the inert precursor may be adjusted to tune oxidative effect of the oxygen-containing precursor and/or oxidation selectivity.

A flow rate of the oxygen-containing precursor and the inert precursor, if present, may be sufficient to oxidize silicon-and-germanium-containing material relative on the substrate. In embodiments, a flow rate of the oxygen-containing precursor to the processing region may be greater than or about 1 sccm, and may be greater than or about 10 sccm, greater than or about 50 sccm, greater than or about 100 sccm, greater than or about 250 sccm, greater than or about 500 sccm, greater than or about 1,000 sccm, greater than or about 1,500 sccm, greater than or about 2,000 sccm, greater than or about 2,500 sccm, greater than or about 3,000 sccm, greater than or about 3,500 sccm, greater than or about 4,000 sccm, or higher. However, to control the oxidative effect, the flow rate of the oxygen-containing precursor may also be limited to less than or about 1,000 sccm, and may be limited to less than or about 1,000 sccm, less than or about 750 sccm, less than or about 500 sccm, less than or about 250 sccm, less than or about 200 sccm, less than or about 150 sccm, less than or about 100 sccm, less than or about 50 sccm, less than or about 40 sccm, less than or about 30 sccm, less than or about 20 sccm, less than or about 10 sccm, or less. Additionally, a flow rate of the inert precursor, which may dilute and/or distribute the oxygen-containing precursor or plasma effluents thereof may be greater than or about 100 sccm, and may be greater than or about 250 sccm, greater than or about 500 sccm, greater than or about 750 sccm, greater than or about 1,000 sccm, greater than or about 2,500 sccm, greater than or about 5,000 sccm, greater than or about 7,500 sccm, greater than or about 10,000 sccm, or higher.

In some embodiments, plasma effluents of the oxygen-containing precursor may be generated at optional operation 425. As discussed, the plasma effluents may be generated in the processing region. However, it is contemplated that plasma effluents may not be formed of the oxygen-containing precursor and a plasma-free or thermal oxidation may be performed. For example, the plasma effluents may oxidize all materials on the substrate. Accordingly, a subsequent etch to selectively remove one silicon-and-germanium-containing material relative to another silicon-and-germanium-containing material may not be able to differentiate between the oxidized silicon-and-germanium-containing materials if an amount of oxidation is too excessive. In embodiments where plasma effluents of the oxygen-containing precursor are formed, the plasma effluents of the oxygen-containing precursor and the inert precursor, if present, may be generated at a plasma power of less than or about 5,000 W, and may be generated at less than or about 4,750 W, less than or about 4,500 W, less than or about 4,250 W, less than or about 4,000 W, less than or about 3,750 W, less than or about 3,500 W, less than or about 3,250 W, less than or about 3,000 W, less than or about 2,750 W, less than or about 2,500 W, less than or about 2,250 W, less than or about 2,000 W, less than or about 1,750 W, less than or about 1,500 W, less than or about 1,250 W, less than or about 1,000 W, less than or about 750 W, less than or about 500 W, less than or about 250 W, or less. Compared to the pre-treatment precursor, plasma effluents of the oxygen-containing precursor may be generated at a lower plasma power. By generating plasma effluents of the oxygen-containing precursor at a lower plasma power, oxidation may be better controlled.

Method 400 may include contacting the substrate with the oxygen-containing precursor, or plasma effluents thereof, at operation 430. The contacting may continue for a sufficient period of time to oxidize the multiple silicon-and-germanium-containing materials on the substrate. In embodiments, the period of time may be greater than or about 3 seconds, greater than or about 5 seconds, greater than or about 10 seconds, greater than or about 20 seconds, greater than or about 30 seconds, greater than or about 40 seconds, greater than or about 50 seconds, greater than or about 1 minute, greater than or about 2 minutes, greater than or about 3 minutes, greater than or about 5 minutes, or higher. However, at greater durations, oxidation of the silicon-and-germanium-containing materials may be too excessive, and a subsequent etch to selectively remove one silicon-and-germanium-containing material relative to another silicon-and-germanium-containing material may not be able to differentiate between the oxidized silicon-and-germanium-containing materials. As such, the period of time may be less than or about 5 minutes, less than or about 3 minutes, less than or about 2 minutes, less than or about 1 minute, less than or about 50 seconds, less than or about 40 seconds, less than or about 30 seconds, less than or about 20 seconds, less than or about 10 seconds, less than or about 5 seconds, less than or about 3 seconds, or less.

By contacting the substrate with the oxygen-containing precursor, germanium and/or silicon in silicon-and-germanium-containing material may bond with oxygen to oxidize a portion of the silicon-and-germanium-containing material. Without being bound by any particular theory, it is believed that germanium may more readily bond with oxygen, and silicon-and-germanium-containing material with a higher germanium concentration may oxidize easier than neighboring silicon-and-germanium-containing material with a lesser germanium concentration. Additionally, it is believed Si—Ge bonds in the silicon-and-germanium-containing material may break easier than Si—Si bonds in neighboring silicon-containing material, and the silicon-and-germanium-containing material characterized by a higher germanium concentration may oxidize easier than neighboring silicon-and-germanium-containing material and/or silicon-containing material. Additionally, by operating at temperature and/or pressure ranges discussed below, the silicon-and-germanium-containing material with a higher germanium concentration may be more readily oxidized.

At operation 435, method 400 may include providing an etchant precursor to the processing region of the semiconductor processing chamber. In some embodiments, an inert precursor may be provided with the etchant precursor. The etchant precursor may be a halogen-containing precursor or any other precursor able to etch silicon-and-germanium-containing material. The etchant precursor may be or include, for example, diatomic fluorine ($F_2$), nitrogen trifluoride ($NF_3$), hydrogen fluoride (HF), or any other fluorine-containing precursor used or useful in semiconductor processing. In embodiments, $F_2$ may be used as the tenant precursor to maintain or increase selectivity between silicon-and-germanium-containing material and silicon-containing material that may be present on the substrate. The inert precursor may be or include, for example, argon, helium, xenon, or other noble, inert, or useful precursors. The inert precursor may be used to dilute the etchant precursor, which may further reduce etching rates to control the etch and the selectivity of the etch, or to assist in distributing the etchant precursor throughout the processing region. Additionally, a flow rate ratio of the etchant precursor and, if present, the inert precursor may be adjusted to tune etching selectivity.

A flow rate of the etchant precursor and the inert precursor, if present, may be sufficient to selectively etch one silicon-and-germanium-containing material relative to another silicon-and-germanium-containing material. In embodiments, a flow rate of the etchant precursor to the processing region may be greater than or about 1 sccm, and may be greater than or about 10 sccm, greater than or about 50 sccm, greater than or about 100 sccm, greater than or about 250 sccm, greater than or about 500 sccm, greater than or about 1,000 sccm, greater than or about 1,500 sccm, greater than or about 2,000 sccm, greater than or about 2,500 sccm, greater than or about 3,000 sccm, greater than or about 3,500 sccm, greater than or about 4,000 sccm, or higher. Additionally, a flow rate of the inert precursor, which may dilute and/or distribute the etchant precursor or plasma effluents thereof may be greater than or about 100 sccm, and may be greater than or about 250 sccm, greater than or about 500 sccm, greater than or about 750 sccm, greater than or about 1,000 sccm, greater than or about 2,500 sccm, greater than or about 5,000 sccm, greater than or about 7,500 sccm, greater than or about 10,000 sccm, or higher.

In some embodiments, plasma effluents of the etchant precursor may be generated at optional operation 440. As discussed, the plasma effluents may be generated in the processing region. However, it is contemplated that plasma effluents may not be formed of the etchant precursor and a plasma-free or thermal etch may be performed. For example, the plasma effluents may etch all silicon-and-germanium-containing materials on the substrate. As such, a plasma-free or thermal etch may maintain selectivity between silicon-and-germanium-containing materials that may be present on the substrate characterized by differing germanium concentrations. Accordingly, using plasma effluents of the etchant precursor may not selectively remove one silicon-and-germanium-containing material relative to another silicon-and-germanium-containing material. In embodiments plasma effluents of the fluorine-containing precursor and the inert precursor, if present, may be generated at a plasma power of less than or about 5,000 W, and may be generated at less than or about 4,750 W, less than or about 4,500 W, less than or about 4,250 W, less than or about 4,000 W, less than or about 3,750 W, less than or about 3,500 W, less than or about 3,250 W, less than or about 3,000 W, less than or about 2,750 W, less than or about 2,500 W, less than or about 2,250 W, less than or about 2,000 W, less than or about 1,750 W, less than or about 1,500 W, less than or about 1,250 W, less than or about 1,000 W, less than or about 750 W, less than or about 500 W, less than or about 250 W, or less.

Method 400 may include contacting the substrate with the etchant precursor, or plasma effluents thereof, at operation 445. The contacting may continue for a sufficient period of time to etch at least one of the multiple silicon-and-germanium-containing materials on the substrate. In embodiments, the period of time may be greater than or about 3 seconds, greater than or about 5 seconds, greater than or about 10 seconds, greater than or about 20 seconds, greater than or about 30 seconds, greater than or about 40 seconds, greater than or about 50 seconds, greater than or about 1 minute, greater than or about 2 minutes, greater than or about 3 minutes, greater than or about 5 minutes, or higher. Similarly, the period of time may be less than or about 5 minutes, less than or about 3 minutes, less than or about 2 minutes, less than or about 1 minute, less than or about 50 seconds, less than or about 40 seconds, less than or about 30 seconds, less than or about 20 seconds, less than or about 10 seconds, less than or about 5 seconds, less than or about 3 seconds, or less.

By contacting the substrate with the etchant precursor, the non-oxidized silicon-and-germanium-containing material may be selectively removed relative to other materials on the substrate, including the oxidized silicon-and-germanium-containing material. Without being bound by any particular theory, it is believed that the silicon-and-germanium-containing material that is more heavily oxidized may be less resistant to the etchant precursor compared to the silicon-and-germanium-containing material that is less oxidized. That is, it may be easier to breakthrough oxidation on the silicon-and-germanium-containing material characterized by a higher germanium concentration and, therefore, remove silicon-and-germanium-containing material with a higher amount of Ge—O bonds. Therefore, the silicon-and-germanium-containing material characterized by a higher germanium concentration and, therefore, a higher amount of Ge—O bonds may be selectively removed compared to the other silicon-and-germanium-containing material. As such, the silicon-and-germanium-containing material characterized by a higher germanium concentration, such as dummy material serving as a placeholder for the middle dielectric isolation in CFET processing, may be selectively removed relative to the silicon-and-germanium-containing material characterized by a lesser germanium concentration, such as gates in CFET processing, as well as silicon-containing material, such as channels in CFET processing.

In embodiments, operations 405-415 may be performed in the same semiconductor processing chamber as operations 420-430, or the substrate may be transferred to a second processing region of a second semiconductor processing chamber to selectively oxidize silicon-and-germanium-containing material on the substrate at operations 420-430. However, the second semiconductor processing chamber may be on the same processing system or mainframe, such as processing system 100, as the semiconductor processing chamber used during operations 405-415. Additionally, operations 430-445 may be performed in the same semiconductor processing chamber as operations 405-415 and/or operations 420-430, or the substrate may be transferred to a third processing region of a third semiconductor processing chamber to selectively etch one silicon-and-germanium-containing material on the substrate at operations 435-445. However, the third semiconductor processing chamber may be on the same processing system or mainframe, such as processing system 100, as the semiconductor processing chamber used during operations 405-415 and/or operations 420-430. Accordingly, contacting the substrate with the pre-treatment precursor, contacting the substrate with the oxygen-containing precursor, and contacting the substrate with the etchant precursor may be performed on a single mainframe.

Process conditions may also impact the operations performed in method 400 as well as other etching methods according to the present technology. Each of the operations of method 400 may be performed during a constant temperature in embodiments, while in some embodiments the temperature may be adjusted during different operations. Higher temperatures may increase the etch rate of one silicon-and-germanium-containing material relative to other materials on the substrate. In embodiments, the substrate, pedestal, or chamber temperature may be maintained between about −40° C. and about 200° C. For example, the substrate, pedestal, or chamber temperature may be maintained at greater than or about or about −40° C., greater than or about or about −30° C., greater than or about or about −20° C., greater than or about or about −10° C., greater than or about or about 0° C., greater than or about or about 10° C., greater than or about or about 20° C., greater than or about or about 30° C., greater than or about or about 40° C., greater than or about or about 50° C., greater than or about or about 60° C., greater than or about or about 80° C., greater than or about or about 100° C., greater than or about or about 120° C., greater than or about or about 140° C., greater than or about or about 160° C., greater than or about or about 180° C., greater than or about or about 200° C., or more. Although the etching may be a thermal etch and be performed plasma-free, some radicals may be formed during the etch. At higher temperatures, radicals with higher energy may be formed and may begin etching materials to be maintained at a higher rate. Therefore, at higher temperatures, selectivity may decrease. As such, the substrate, pedestal, or chamber temperature may be maintained at less than or about 200° C., less than or about 180° C., less than or about 160° C., less than or about 140° C., less than or about 120° C., less than or about 100° C., less than or about 75° C., less than or about 60° C., less than or about 40° C., less than or about 30° C., less than or about 20° C., less than or about 10° C., less than or about 0° C., less than or about −10° C., less than or about −20° C., less than or about −30° C., or less.

The pressure within the chamber may also affect the operations performed, and in embodiments the pressure within the semiconductor processing chamber may be maintained at greater than about 1 Torr, greater than or about 2 Torr, greater than or about 3 Torr, greater than or about 4 Torr, greater than or about 5 Torr, greater than or about 6 Torr, greater than or about 7 Torr, greater than or about 10 Torr, greater than or about 12.5 Torr, greater than or about 15 Torr, greater or about 17.5 Torr, greater than or about 20 Torr, greater than or about 22.5 Torr, greater than or about 25 Torr, greater or about 27.5 Torr, greater than or about 30 Torr, or more. Each of the operations of method 400 may be performed during a constant pressure in embodiments, while in some embodiments the pressure may be adjusted during different operations. In embodiments, increased pressure, such as a pressure greater than or about 7 Torr may increase recombination of radicals that may be formed during the etching. However, it is also contemplated that the pressure within the chamber may also be maintained at less than or about 30 Torr, and may be maintained at less than or about 28 Torr, less than or about 26 Torr, less than or about 24 Torr, less than or about 22 Torr, less than or about 20 Torr, less than or about 18 Torr, less than or about 16 Torr, less than or 14 Torr, less than or about 12 Torr, less than or about 10 Torr, less than or about 8 Torr, or less.

The contacting may etch one layer of silicon-and-germanium-containing material relative to another layer of silicon-and-germanium-containing material at a selectivity of greater than or about 10:1. For example, the layer of silicon-and-germanium-containing material characterized by a higher germanium concentration may be etched at a selectivity of greater than or about 15:1 relative to the layer of silicon-and-germanium-containing material characterized by a less germanium concentration, such as greater than or about 20:1, greater than or about 25:1, greater than or about 30:1, greater than or about 40:1, greater than or about 50:1, greater than or about 75:1, greater than or about 100:1, greater than or about 150:1, greater than or about 250:1, greater than or about 300:1, greater than 400:1, greater than or about 500:1, greater than or about 600:1, greater than or about 700:1, or more.

Figure 5A:
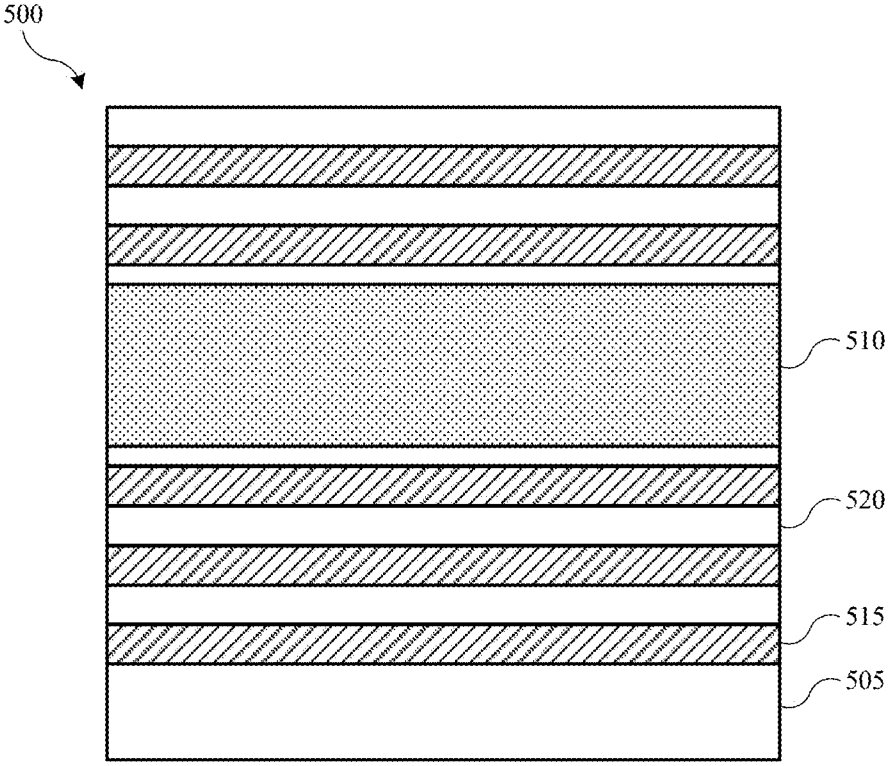
FIGS. 5A-5C show cross-sectional views of substrates being processed according to embodiments of the present technology.
Figure 5B:
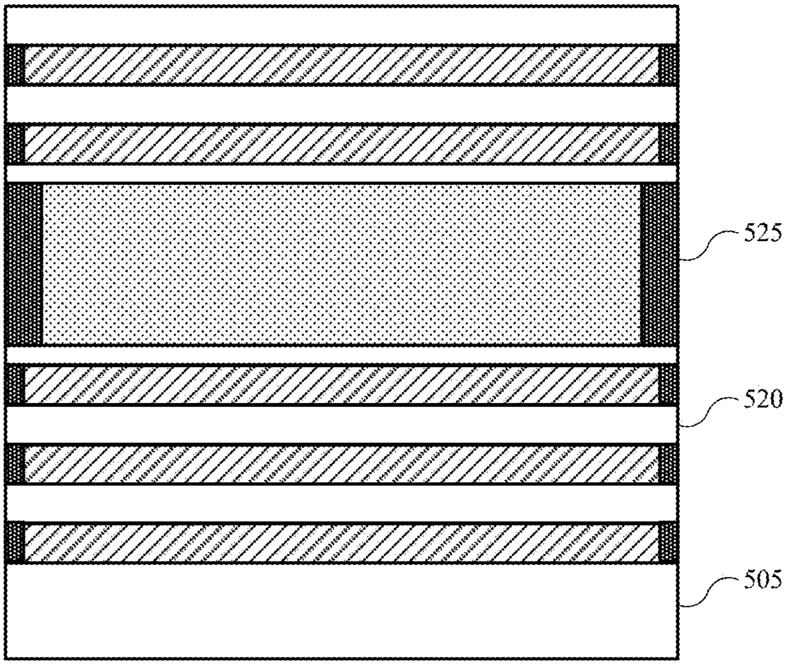
Figure 5C:
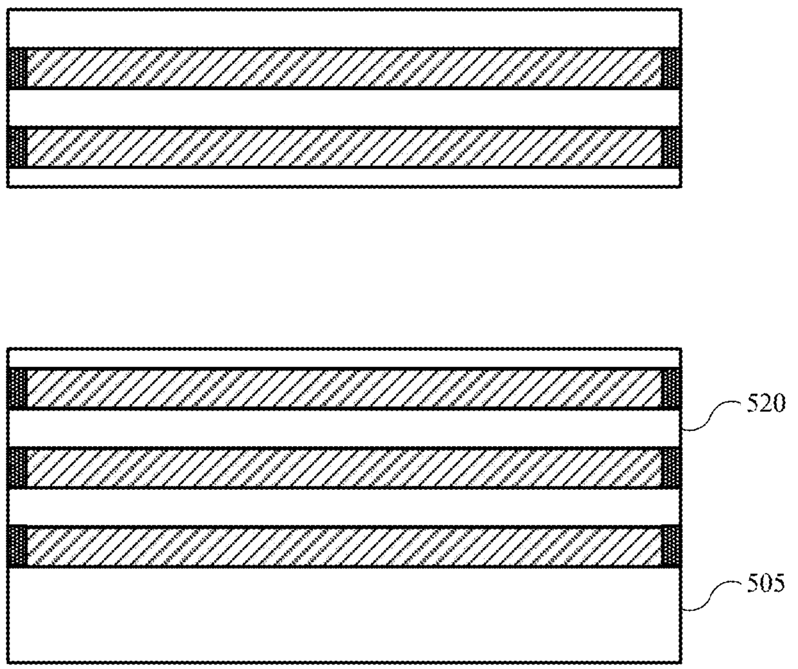

Turning to FIGS. 5A-5C, cross-sectional views of structure 500 being processed according to embodiments of the present technology are illustrated. As illustrated in FIG. 5A, structure 500 may include a substrate 505 that may have a plurality of stacked layers overlying the substrate 505, which may include silicon-containing material, silicon-and-germanium-containing material, or other substrate materials. The layers of material may include materials suitable for CFETs, such as a first layer of silicon-and-germanium-containing material 510, which may be dummy material serving as a placeholder for a middle dielectric isolation in CFET processing. The layers of material may also include one or more second layers of silicon-and-germanium-containing material 515 alternating with one or more layers of silicon-containing material 520. The one or more second layers of silicon-and-germanium-containing material 515 may be gate materials in a CFET. The one or more layers of silicon-containing material 520 may be channel materials in a CFET. The first layer of silicon-and-germanium-containing material 510, serving as a dummy material, may need to be selectively removed to allow for the middle dielectric isolation material to be provided. Although illustrated with only twelve layers of material, exemplary structures may include any number of layers. Memory holes or trenches may be defined through the layers to the level of substrate 505.

In embodiments, the first layer of silicon-and-germanium-containing material 510 may be characterized by a germanium concentration greater than the second layer of silicon-and-germanium-containing material 515. For example, the first layer of silicon-and-germanium-containing material 510 may be characterized by a germanium concentration of greater than or about 20 at. %, and may be characterized by a germanium concentration of greater than or about 22 at. %, greater than or about 24 at. %, greater than or about 25 at. %, greater than or about 26 at. %, greater than or about 28 at. %, greater than or about 30 at. %, greater than or about 32 at. %, greater than or about 34 at. %, greater than or about 36 at. %, greater than or about 38 at. %, greater than or about 40 at. %, greater than or about 45 at. %, or more. Conversely, the second layer of silicon-and-germanium-containing material 515 may be characterized by a germanium concentration less than or about 25 at. %, and may be characterized by a germanium concentration of less than or about 20 at. %, less than or about 19 at. %, less than or about 18 at. %, less than or about 17 at. %, less than or about 16 at. %, less than or about 15 at. %, less than or about 14 at. %, less than or about 13 at. %, less than or about 12 at. %, less than or about 11 at. %, less than or about 10 at. %, or less.

FIG. 5B may illustrate the structure after some operations of methods according to the present technology have been performed, such as discussed with respect to FIG. 4 above. Contacting the substrate with the oxygen-containing precursor, such as at operation 430 of method 400, may oxidize at least a portion of the first layer of silicon-and-germanium-containing material 510 second layer of silicon-and-germanium-containing material 515. The portion of the first layer of silicon-and-germanium-containing material 510 second layer of silicon-and-germanium-containing material 515 may be an oxidized silicon-and-germanium-containing material 525. As previously discussed with regard to methods according to the present technology, such as discussed with respect to FIG. 4 above, the first layer of silicon-and-germanium-containing material 510 may oxidize to a greater degree relative to the second layer of silicon-and-germanium-containing material 515 due to the increased germanium concentration of the first layer of silicon-and-germanium-containing material 510. Accordingly, during a subsequent etch to remove the first silicon-and-germanium-containing material 515, etchant species may breakthrough the oxidized silicon-and-germanium-containing material 525 of the first layer of silicon-and-germanium-containing material 510. This breakthrough may result in the first layer of silicon-and-germanium-containing material 510 being selectively etched.

FIG. 5C illustrates the structure after further operations of methods according to the present technology have been performed, such as discussed with respect to FIG. 4 above. An etching operation may be performed to remove the first layer of silicon-and-germanium-containing material 510. The etching may remove the first layer of silicon-and-germanium-containing material 510 to provide a region for a middle dielectric isolation material to be formed, such as in CFET processing. Structure 500 may show minimal or zero etching of the second layer of silicon-and-germanium-containing material 515 and/or the silicon-containing material 520 due to the selective etch of the first layer of silicon-and-germanium-containing material 510.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a precursor” includes a plurality of such precursors, and reference to “the material” includes reference to one or more materials and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

providing a pre-treatment precursor to a processing region of a semiconductor processing chamber, wherein a substrate is housed within the processing region, wherein a first layer of silicon-and-germanium-containing material and a second layer of silicon-and-germanium-containing material are disposed on the substrate, and wherein a native oxide is present on the first layer of silicon-and-germanium-containing material and the second layer of silicon-and-germanium-containing material;

contacting the substrate with the pre-treatment precursor, wherein the contacting removes the native oxide from the first layer of silicon-and-germanium-containing material and the second layer of silicon-and-germanium-containing material;

providing an oxygen-containing precursor to the processing region;

contacting the substrate with the oxygen-containing precursor, wherein the contacting oxidizes at least a portion of the first layer of silicon-and-germanium-containing material and at least a portion of the second layer of silicon-and-germanium-containing material;

providing an etchant precursor to the processing region; and contacting the substrate with the etchant precursor, wherein the contacting selectively etches the first layer of silicon-and-germanium-containing material.

2. The semiconductor processing method of claim 1, wherein:

the first layer of silicon-and-germanium-containing material is characterized by a first germanium concentration;

the second layer of silicon-and-germanium-containing material is characterized by a second germanium concentration; and the first germanium concentration is greater than the second germanium concentration.

3. The semiconductor processing method of claim 1, wherein the pre-treatment precursor comprises a hydrogen-containing precursor or a nitrogen-containing precursor.

4. The semiconductor processing method of claim 3, wherein:

the hydrogen-containing precursor comprises diatomic hydrogen ($H_2$) or ammonia ($NH_3$); and the nitrogen-containing precursor comprises diatomic nitrogen ($N_2$) or $NH_3$.

5. The semiconductor processing method of claim 1, further comprising:

forming plasma effluents of the pre-treatment precursor.

6. The semiconductor processing method of claim 1, wherein the oxygen-containing precursor comprises diatomic oxygen ($O_2$) or steam ($H_2O$).

7. The semiconductor processing method of claim 1, wherein the processing region is maintained plasma-free while contacting the substrate with the oxygen-containing precursor.

8. The semiconductor processing method of claim 1, wherein a temperature in the processing region is maintained at less than or about 100° C.

9. The semiconductor processing method of claim 1, wherein a pressure in the processing region is maintained at greater than or about 3 Torr.

10. The semiconductor processing method of claim 1, wherein the contacting etches the first layer of silicon-and-germanium-containing material relative to the second layer of silicon-and-germanium-containing material at a selectivity of greater than or about 20:1.

11. The semiconductor processing method of claim 1, wherein contacting the substrate with the pre-treatment precursor, contacting the substrate with the oxygen-containing precursor, and contacting the substrate with the etchant precursor is performed on a single mainframe.

12. A semiconductor processing method comprising:

providing an oxygen-containing precursor to a processing region of a semiconductor processing chamber, wherein a substrate is housed within the processing region, wherein a first layer of silicon-and-germanium-containing material and a second layer of silicon-and-germanium-containing material are disposed on the substrate, and wherein the first layer of silicon-and-germanium-containing material is characterized by a greater germanium concentration than the second layer of silicon-and-germanium-containing material;

contacting the substrate with the oxygen-containing precursor, wherein the contacting at least partially oxidizes the first layer of silicon-and-germanium-containing material to a greater degree than the second layer of silicon-and-germanium-containing material;

providing a fluorine-containing precursor to the processing region; and contacting the substrate with the fluorine-containing precursor, wherein the contacting etches the first layer of silicon-and-germanium-containing material relative to the second layer of silicon-and-germanium-containing material at a selectivity of greater than or about 40:1.

13. The semiconductor processing method of claim 12, wherein the first layer of silicon-and-germanium-containing material is characterized by a germanium concentration of greater than or about 25 at. %.

14. The semiconductor processing method of claim 12, wherein the second layer of silicon-and-germanium-containing material is characterized by a germanium concentration of less than or about 20 at. %.

15. The semiconductor processing method of claim 12, wherein the oxygen-containing precursor comprises water or steam ($H_2O$).

16. The semiconductor processing method of claim 15, wherein the processing region is maintained plasma-free while contacting the substrate with the oxygen-containing precursor and while contacting the substrate with the fluorine-containing precursor.

17. The semiconductor processing method of claim 12, wherein a native oxide is present on the first layer of silicon-and-germanium-containing material and the second layer of silicon-and-germanium-containing material, the method further comprising:

providing a pre-treatment precursor to the processing region; and contacting the substrate with the pre-treatment precursor, wherein the 5 contacting removes the native oxide from the first layer of silicon-and-germanium-containing material and the second layer of silicon-and-germanium-containing material.

18. A semiconductor processing method comprising:

providing a hydrogen-containing precursor or a nitrogen-containing precursor to a processing region of a semiconductor processing chamber, wherein a substrate is housed within the processing region, wherein a first layer of silicon-and-germanium-containing material and a second layer of silicon-and-germanium-containing material are disposed on the substrate, wherein the first layer of silicon-and-germanium-containing material is characterized by a greater germanium concentration than the second layer of silicon-and-germanium-containing material, and wherein a native oxide is present on the first layer of silicon-and-germanium-containing material and the second layer of silicon-and-germanium-containing material;

contacting the substrate with the hydrogen-containing precursor or the nitrogen-containing precursor, wherein the contacting removes the native oxide from the first layer of silicon-and-germanium-containing material and the second layer of silicon-and-germanium-containing material;

providing an oxygen-containing precursor to the processing region, wherein the oxygen-containing precursor comprises water or steam ($H_2O$);

contacting the substrate with the oxygen-containing precursor, wherein the contacting oxidizes at least a portion of the first layer of silicon-and-germanium-containing material and at least a portion the second layer of silicon-and-germanium-containing material, and wherein the processing region is maintained plasma-free while contacting the substrate with the oxygen-containing precursor;

providing a fluorine-containing precursor to the processing region; and contacting the substrate with the fluorine-containing precursor, wherein the contacting selectively etches the first layer of silicon-and-germanium-containing material, and wherein the processing region is maintained plasma-free while contacting the substrate with the fluorine-containing precursor.

19. The semiconductor processing method of claim 18, wherein a temperature in the processing region is maintained at less than or about 75° C.

20. The semiconductor processing method of claim 18, wherein contacting the substrate with the fluorine-containing precursor etches the first layer of silicon-and-germanium-containing material relative to the second layer of silicon-and-germanium-containing material at a selectivity of greater than or about 10:1.

* * * * *